United States Patent [19]

Kawada et al.

[11] Patent Number: 5,001,421
[45] Date of Patent: Mar. 19, 1991

[54] ASSEMBLY TO BE FITTED IN A CYLINDER OF A PROBE PROVIDED WITH A FUNCTION TO HOLD AN ELECTRIC PARTS UNIT

[75] Inventors: Kazuo Kawada, Higashi Murayama; Hiroshi Noguchi, Hamura, both of Japan

[73] Assignee: Stack Electronics Co., Ltd., Akishima, Japan

[21] Appl. No.: 458,228

[22] Filed: Dec. 28, 1989

[51] Int. Cl.⁵ ............................................. G01R 31/02
[52] U.S. Cl. ............................ 324/158 P; 324/72.5
[58] Field of Search ............... 324/158 F, 158 P, 72.5, 324/149; 439/482, 824; 361/399

[56] References Cited

U.S. PATENT DOCUMENTS

| 2,677,117 | 4/1954 | Swain | 324/149 |
|---|---|---|---|
| 2,883,619 | 4/1959 | Kobbe et al. | 324/149 |
| 3,826,981 | 7/1974 | Ross | 324/149 |
| 4,418,314 | 11/1983 | Nieto, Jr. | 324/158 P |
| 4,536,710 | 8/1985 | Dunham | 324/253 |

Primary Examiner—Kenneth Wieder
Assistant Examiner—Vinh P. Nguyen
Attorney, Agent, or Firm—Lackenbach Siegel Marzullo & Aronson

[57] ABSTRACT

An electric parts unit is located between a pair of holders formed inside surface of a jointing portion of a frame of an assembly. When the assembly is inserted into a cylinder, a projection(s), which is on an outer surface of the jointing portion and has relation to the positions of the holders, is (are) pressed by an inner surface of the cylinder so that the jointing portion bends inward and the holders hold the electric parts unit. Therefore, even if the probe is used under a quaking condition, the electric parts unit will not be quaked so that any noise will not be produced.

4 Claims, 2 Drawing Sheets

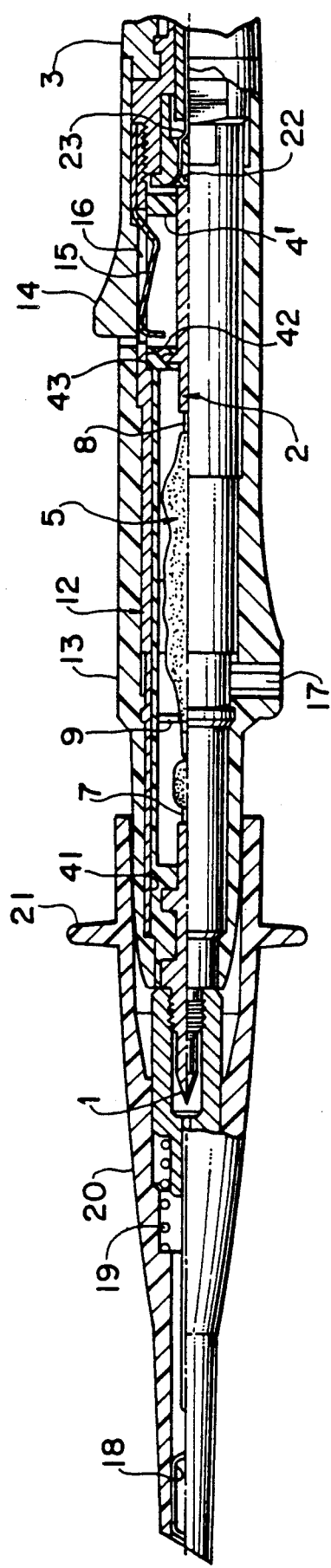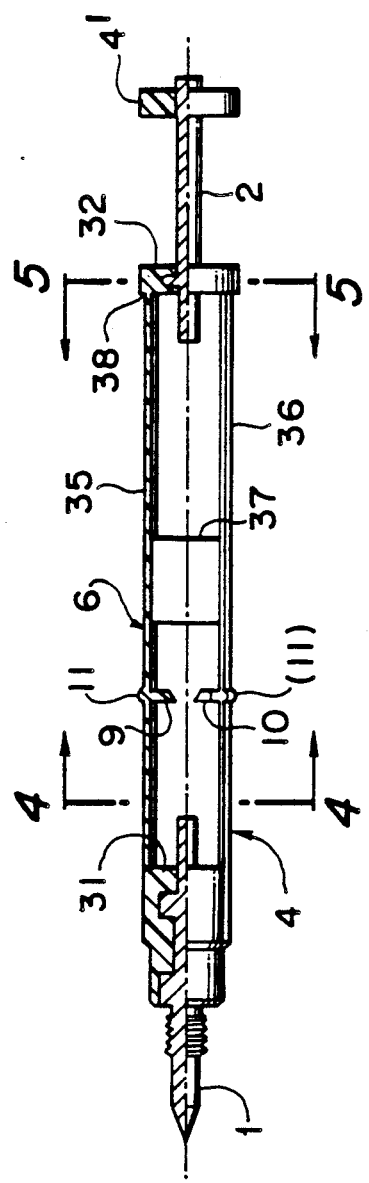

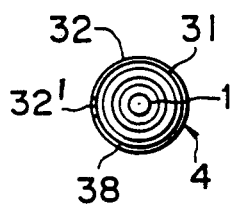
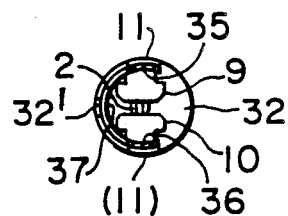
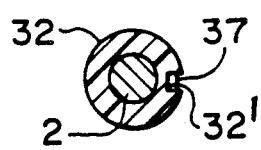
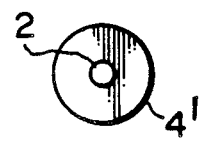
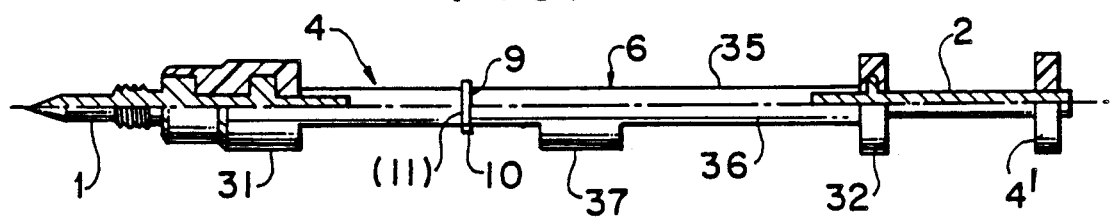
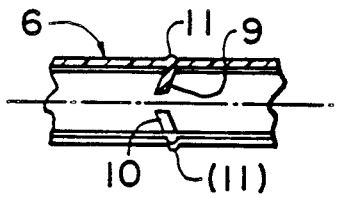
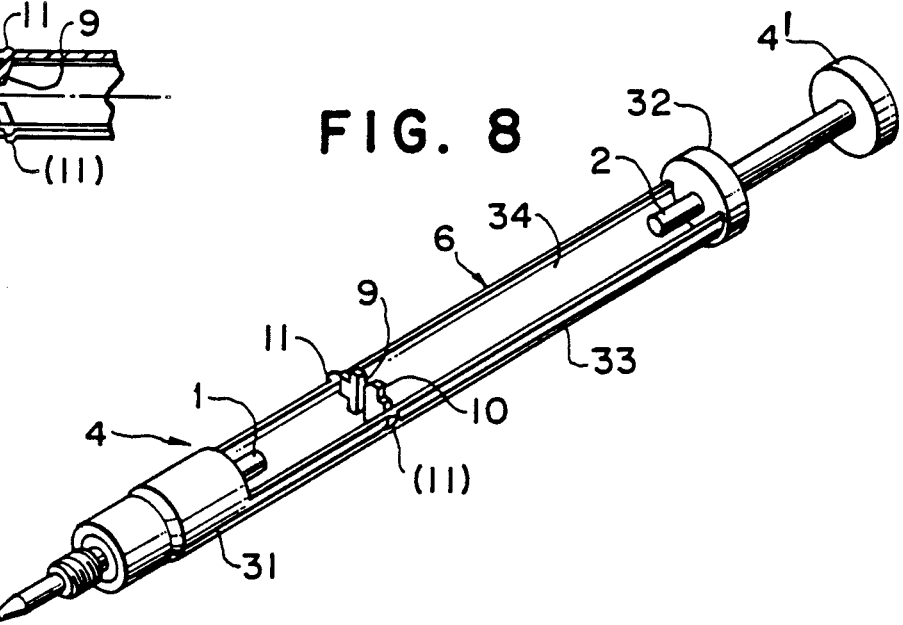

ASSEMBLY TO BE FITTED IN A CYLINDER OF A PROBE PROVIDED WITH A FUNCTION TO HOLD AN ELECTRIC PARTS UNIT

BACKGROUND OF THE INVENTION

1. Field of the Invention

The present invention relates to an assembly to be fitted in a cylinder of a probe provided with a function to hold an electric parts unit.

2. Prior Art

A touching needle installed on an end of a cylinder through the medium of an insulating material. An assembly, which is formed by connecting an electric parts unit with a connecting portion for a coaxial cable, is inserted into the cylinder through the other end thereof.

An inserting end of the assembly is a lead projecting from the electric parts unit, or is a splitted end of a spring member soldered on the lead.

In a probe with a circuit for high and low impedance, a changeover switch is installed on a connecting part for a coaxial cable.

A receiving recess is formed on an inner end of the touching needle. A hole to be used for soldering is formed from the outer side surface of the needle to the receiving recess. The lead or the spring member is inserted into the receiving recess, and is soldered on the touching needle by pouring solder through the hole.

The leads projecting from both ends of the electric parts unit have a very small diameter of about 0.4 mm, so that the electric parts unit is quaked easily when the probe comes into contact with a quaking examinee or when its user is on a quaking thing. when the electric parts unit quakes, noise may be produced and disturb waves of an oscilloscope, which makes it impossible to measure the waves accurately.

SUMMARY OF THE INVENTION

An object of this invention is to present an assembly provided with a function to hold an electric parts unit. In order to achieve this object, an assembly of this invention comprises a touching needle, a connecting portion for a coaxial cable, a frame on which the touching needle and the connecting portion are fixed coaxially being spaced from each other, and an electric parts unit being connected with the touching needle and the connecting portion; a pair of holders facing each other are formed inside of the jointing portion on a cross section thereof, and at least one projection is formed on an outer surface thereof in relation to one of the holders, the length from the axial line of the assembly to the outer end of the projection is larger than the inner radius of the cylinder.

The touching needle and the connecting portion are preferably fixed on the frame as the frame is being molded. They can however be fixed on the pre-molded frame. An electric parts unit is joined on to the touching needle and the connecting portion by welding, soldering and so on. The electric parts unit is as well-known composed of a condenser(s) and a resistance(s).

The assembly is inserted with the touching needle first into a cylinder through an end thereof. When the tip of the touching needle comes out from the other end of the cylinder, the cylinder is calked to become one body with the touching needle.

When the assembly is inserted into the cylinder, the projection is pressed by the inner surface of the cylinder and the electric parts unit 5 is held tightly by the holders.

The cylinder is received in a overcoat as usual. The connecting portion is connected with a coaxial cable. Another touching needle may be connected with the tip of said touching needle, and these touching needles may be covered by a movable overcoat, which is able to move in relation to said overcoat, and which has a tendency to enclose the touching needles. When the mavable overcoat is pulled down against the tendency thereof, the foremost touching needle can come out from the movable overcoat.

Another object of this invention is to present a frame, which comprises a jointing portion and holding portions at both ends thereof; the holding portions are able to hold a touching needle and a connecting portion on an axial line of a cylinder while the assembly is fitted in the cylinder. To achieve this object, the holding portions are cylindrical so as to fit in the cylnder. As the holding portions fit in the cylinder tightly and coaxially, the touching needle and the connecting portion are kept coaxial with the cylinder.

Another object of this invention is to present a jointing portion of the frame that is light and strong enough. In order to achieve this object, the jointing portion comprises a pair of lumbers which are parallel with each other and the middle parts of which are joined with each other by an arch segment. An electric parts unit is able to be received between the segments. The leads of the electric parts unit can be soldered with the touching needle and the connecting portion through the space between the segments.

Another object of this invention is to present a jointing portion of a frame which is strong, simple and has an enough space to receive an electric parts unit. In order to achieve this object the jointing portion is of semi-cylindrical body having a cut-away portion. The electric parts unit can be soldered with the touching needle and the connecting portion through the cut-away portion.

Another object of this invention is to present an assembly and a cylinder with such means as to realize a predetermined length of fit easily and surely. In order to achieve this object, the inner diameter of the part of the cylinder where the holding portion of the frame for the touching needle fits in is narrower than the inner diameter of the part where the holding portion for the connecting portion of the frame fits in, and a step between both parts comes into contact with a step formed between an outer surface of the holding portion of the connecting portion of said frame and the outer surface of the jointing portion, when the assembly fits in the straight tip in a predetermined length of fit.

Another object of this invention is to present an assembly comprising a pair of holders which is able to release excessive forces along the axial line thereof so as not to damage the electric parts unit when they catch the electric parts unit. In order to achieve this object, the holders incline in the same direction in relation to the jointing portion.

Other objects of this invention will be clear referring to the attached drawings and the description thereof. In the drawings the same numerals indicates the same or corresponding parts.

BRIEF DESCRIPTION OF THE DRAWINGS

FIG. 1 is a partially sectioned side view of a probe comprising an assembly of this invention, FIG. 2 is a partially sectioned side view of the assembly without the electric parts unit, FIG. 3 is a left side view of FIG. 2, FIG. 4 is a view sectioned along line 4—4 of FIG. 2, FIG. 5 is a view sectioned along line 5—5 of FIG. 2, FIG. 6 is a right side view of FIG. 2, FIG. 7 is a bottom view of FIG. 2, FIG. 8 is an isometric view showing another embodiment of an assembly according to this invention except an electric parts unit, and FIG. 9 is a sectional view showing another embodiment of a pair of holders.

DETAILED DESCRIPTION OF THE INVENTION

In FIG. 1 an assembly comprises a touching needle 1, a connectiong portion 2 with a coaxial cable 3, a frame 4 and an electric parts unit 5. The touching needle 1 and the connecting portion 2 are, being spaced from each other by jointing portion 6 of the frame 4, fixed coaxially on the frame 4.

An electric parts unit 5 has a condenser and a resistance as usual. By welding and so on, an end 7 of the unit 5 is connected with the touching needle 1, and the other end 8 of the unit 5 is connected with the connecting portion 2.

A pair of holders 9 and 10 are formed inside of the jointing portion 6 of the frame 4 on a cross section thereof. On an outer surface of the frame 4 a projection 17 is formed in relation to the holder 9, on an extension line thereof for example. Another projection may be formed in relation to the holder 10. The length from the axial line of the assembly to the outer end of the projection 17 is longer than the inner radius of the cylinder 18. So that, when the assembly is inserted into the cylinder 18, the projection 17 is pressed by the inner surface of the cylinder 18 and the electric parts unit 5 is held tightly by the holders 9 and 10.

The assembly is inserted into a metal cylinder 12 through an end opening thereof and fixed in the cylinder 12 by calking and so on. An overcoat 13 receives the cylinder 12. An end of a spring 15, which detects zero electric potential of an oscilloscope, is fixed on the cylinder 12 and the other free end fits on a swingable push button 14 of the overcoat 13. When the push button 14 is pressed into an opening 16, the free end of the spring 15 comes into contact with the connecting portion 2, which is supported by the frame 4 and a ring 4', to compose an earth circuit. An end of an earthclip (not shown in the drawings) is connected with the cylinder 12 through a hole 17. A touching needle 18 is screwed on the touching needle 1 and is covered by a movable overcoat 20, which tends to move away from the overcoat 13 by a spring 19.

An operator brings the touching needle 1 into direct contact with an examinee. If there is the movable overcoat 20, an operator pulls back the covercoat 20 by a holderle 21 in the direction of the overcoat 13 to expose the touching needle 18 and bring the needle 18 into contact with an examinee. Signals are sent to the oscilloscope through the touching needle 18 if any, the touching needle 1, the electric parts unit 5, the connecting portion 2, a connecting pin 22 and a central conductor 23.

In FIGS. 2 to 8, the frame 4 comprises a holding portion 41 for the touching needle 1 at one end of the jointing portion 6. The supporting portion 31, 32 are cylindrical and able to fit well in the cylinder 12, so that the assembly does not move radially. The supporting portion 32 may be provided with a gutter 32' thereon which, by fitting on a projection (not shown in the drawings) formed on the inner wall of the sylinder, prevents rotation of the portion 32.

The jointing portion 6 comprises a pair of parallel segments 35 and 36 facing each other. An bridge segment 37 bridges over the space between the middle parts of the lumbers 35 and 36. Through this space the ends 7 and 8 can be welded with the needle 1 or the portion 2. The bridge segment 37 strengthens the jointing portion 6. The electric parts unit 5 can be received between the segments 35 and 36 without touching the arch lumber 37.

In FIGS. 1 to 3, the cylinder 12 comprises a smaller diameter chamber 41, in which the supporting portion 31 fits, and a larger diameter chamber 42, in which the supporting portion 32 fits. There is formed a step 43 between the chambers 41 and 42. There is a step 38 between the supporting portion 32 and the jointing portion 6. The frame 4 is inserted into the cylinder 12 until the step 38 comes into contact with the step 43, when the relative positon of the frame 4 and the cylinder 12 are determined.

In FIG. 8 the jointing portion 6 of the frame 4 is of semi-cylinder 33 with a cut-away portion 34.

Welding operations of the end 7 of the electric parts unit 5 and the touching needle 1 can be done by making use of this cut away portion 34, and welding operations of the end 8 and the connecting portion 2 as well. The electric parts unit 5 is fixed in the semi-cylinder 33 through these welding operations.

FIG. 9 shows an embodiment wherein the holders 9 and 10 incline in the same direction in relation to the jointing portion 6. The holders incline preferably toward the touching needle. When the assembly is inserted into the cylinder, the holder 9 and 10 will incline more or bend if necessary so as not to damage the electric parts unit 5.

We claim:

1. An assembly to be fitted into a hollow cylindrical member of a probe, said assembly comprising:
    a longitudinally extending hollow frame having at least partly a cylindrical outer surface and at least partly a circular cross-section;
    a touching needle supported at one end of said frame in axial alignment with the longitudinal axis of said frame;
    a connecting element supported on said frame in axial alignment with the longitudinal axis of said frame and spaced from said touching needle;
    an electric parts unit positioned between said touching needle and said connecting element within said at least partly cylindrical hollow frame having two opposite end terminals which are both in axial alignment with the longitudinal axis of said frame and respectively connected to the adjacent touching needle and connecting element;
    means for holding the electric parts unit in said frame comprised of spaced apart holding elements integral with said frame arranged in a cross-sectional plane perpendicular to the longitudinal axis of said frame and having projections extending in said cross-sectional plane outwardly from said at least partly cylindrical outer surface of said frame for pressing against a hollow probe member into which said assembly is fitted.

2. An assembly in accordance with claim 1, wherein said frame has a first cylindrically-shaped support member coaxial with the longitudinal axis of said frame for supporting the touching needle, a second cylindrically shaped support member coaxial with the longitudinal axis of said frame spaced from said first support member for supporting the connecting element and a cylindrical joining member coaxial with the longitudinal axis of said frame joining said first and second support members.

3. An assembly in accordance with claim 2 wherein the diameter of the first support member is less than the diameter of the second support member so that said second support member forms a stop for predeterminately limiting the extent to which the assembly can be fitted into said probe.

4. An assemby in accordance with claim 1, wherein said jopining member comprises a pair of spaced apart parallel segments which are joined by a bridging segment.

* * * * *